United States Patent
Kamatani

(10) Patent No.: US 8,559,476 B2
(45) Date of Patent: Oct. 15, 2013

(54) SEMICONDUCTOR LASER DRIVER AND IMAGE FORMING APPARATUS INCORPORATING SAME

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 153 days.

(21) Appl. No.: 13/181,658

(22) Filed: Jul. 13, 2011

(65) Prior Publication Data

US 2012/0014401 A1     Jan. 19, 2012

(30) Foreign Application Priority Data

Jul. 15, 2010   (JP) ................................. 2010-160762

(51) Int. Cl.
*H01S 3/00*     (2006.01)
(52) U.S. Cl.
USPC .................. 372/38.02; 25/29.014; 25/29.015; 25/38.07
(58) Field of Classification Search
USPC ................... 372/25, 29.014, 29.015, 38.02
See application file for complete search history.

(56) References Cited

U.S. PATENT DOCUMENTS

| | | | |
|---|---|---|---|
| 6,246,463 B1 | 6/2001 | Hamada et al. | |
| 7,679,296 B2 | 3/2010 | Kamatani | |
| 2003/0112420 A1* | 6/2003 | Suda | 355/67 |
| 2010/0231988 A1 | 9/2010 | Kamatani | |
| 2012/0069120 A1* | 3/2012 | Sakita | 347/118 |

FOREIGN PATENT DOCUMENTS

| | | |
|---|---|---|
| JP | 11-348342 | 12/1999 |
| JP | 2005-153283 | 6/2005 |
| JP | 2006-278403 | 10/2006 |
| JP | 2007-21826 | 2/2007 |
| JP | 2007-73543 | 3/2007 |
| JP | 2007-210238 | 8/2007 |
| JP | 2007-240682 | 9/2007 |
| JP | 2010-213246 | 9/2010 |

OTHER PUBLICATIONS

Chinese official action dated Nov. 20, 2012 in connection with corresponding Chinese patent application No. 201110195151.3.
Korean official action dated Mar. 18, 2013 in corresponding Korean patent application No. 10-2011-0068926.

\* cited by examiner

*Primary Examiner* — Dung Nguyen
(74) *Attorney, Agent, or Firm* — Cooper & Dunham LLP

(57) ABSTRACT

A semiconductor laser driver to execute automatic power control (APC) for multiple semiconductor lasers based on a common APC output from an image controller. The semiconductor laser driver includes a drive circuit to generate an individual APC signal to execute APC for each semiconductor laser based on the common APC signal.

18 Claims, 11 Drawing Sheets

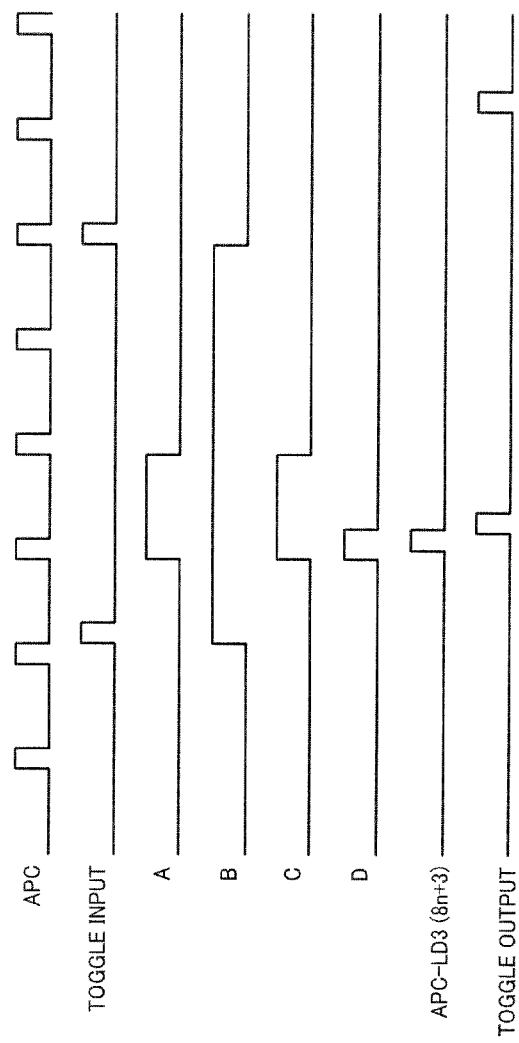

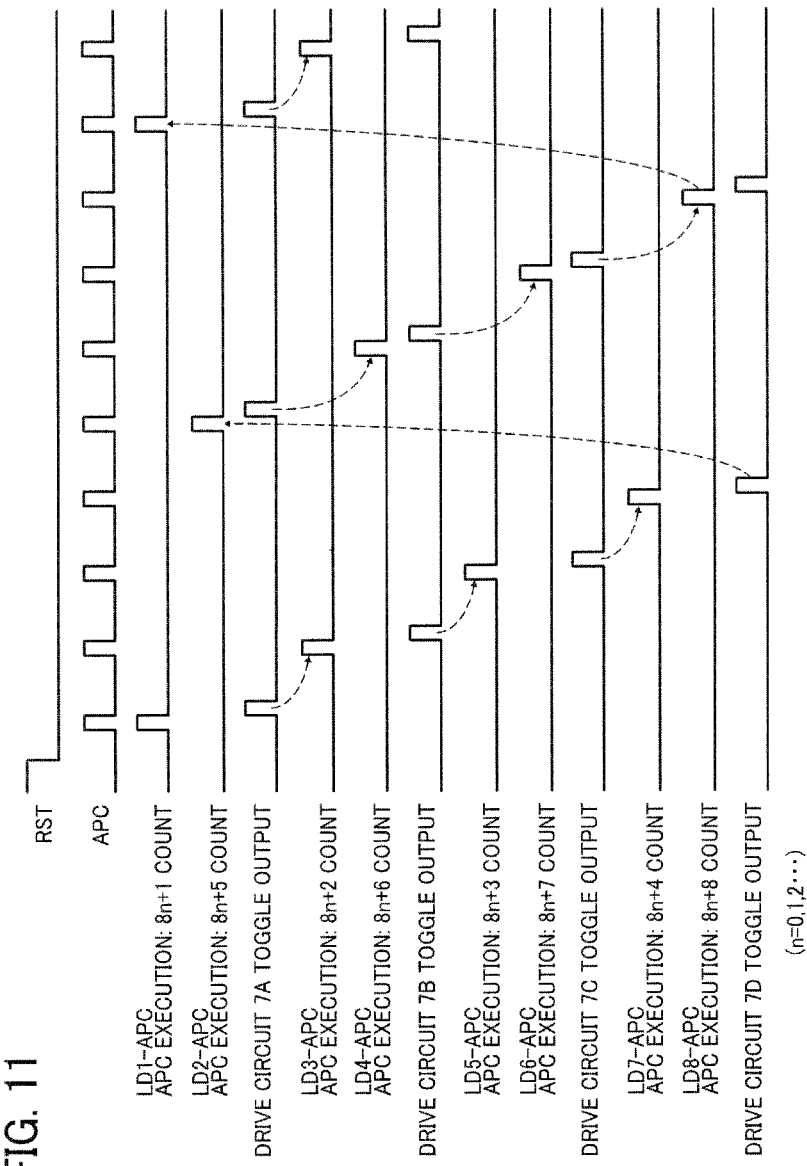

SEMICONDUCTOR LASER DRIVER AND IMAGE FORMING APPARATUS INCORPORATING SAME

CROSS-REFERENCE TO RELATED APPLICATIONS

This patent specification is based on Japanese Patent Application No. 2010-160762 filed on Jul. 15, 2010 in the Japanese Patent Office, the entire contents of which are hereby incorporated by reference herein.

BACKGROUND

1. Technical Field

The present disclosure relates to a semiconductor laser driver and an image forming apparatus incorporating same, and more particularly, a semiconductor laser driver capable of controlling multiple semiconductor lasers such that light-emission intensities of the multiple semiconductor lasers become predetermined light-emission intensities.

2. Description of the Background Art

Recently, semiconductor laser diodes have come to be widely used in a variety of types of electrical equipment, for example, laser printers, optical disk apparatuses, fiber-optic communication apparatuses, and mobile phones, because of their compact size, low cost, and ease of use.

However, the current/light-emission intensity characteristics of the semiconductor laser diode are dependent on temperature. Accordingly, it is necessary to control light-emission intensity to obtain a predetermined light-emission intensity reliably. This light-emission intensity control is called Automatic Power Control (APC). In the APC process, before the semiconductor laser diode is actually driven, the laser diode is driven in advance, a quantity of light output from the laser diode is received by a photodiode (PD), and the detection current values of corresponding quantities of light are stored in a storage device. Then, the laser diode is controlled using the current values saved in the storage device so as to obtain a desired light-emission intensity reliably.

APC is executed by an APC signal output from an image controller that is a previous stage of the semiconductor laser driver. The semiconductor laser driver is contained in a small unit, for example, a so-called laser scanner unit, and is often positioned away from the image controller. The APC signal from the image controller is transmitted to a substrate of the semiconductor laser driver in the laser scanner unit through wiring such as harness.

Heretofore, a single semiconductor laser is controlled by a single APC line. Consequently, the number of APC signal lines increases as the number of semiconductor lasers is increased.

In order to address this problem, several techniques have been proposed. In one example proposed in JP-H11-348342-A, by using a single S/H signal (APC signal) for multiple semiconductor lasers, APC is executed for the semiconductor laser connected to the S/H signal and the image data signal whose states are enabled. Thus, the number of APC signal lines can be reduced. However, this configuration necessitates complicated timing control between the APC signal and the image data signal. Therefore, as the number of semiconductor lasers is increased, control becomes more difficult.

In another example proposed in JP-2007-021826-A, the number of control signals is minimized and a state-machine control circuit at the semiconductor laser driver side executes APC control of the semiconductor lasers. However, although the number of control signals can be reduced by providing state-machine control circuit at the semiconductor laser driver side, such a configuration is complicated and costly because the size of the circuit and substrate area occupied increases.

SUMMARY

In an aspect of this disclosure, there is provided a semiconductor laser driver to execute automatic power control (APC) for multiple semiconductor lasers based on a common APC output from an image controller. The semiconductor laser driver includes a drive circuit to generate an individual APC signal to execute APC for each semiconductor laser based on the common APC signal.

Another aspect of this disclosure, there is provided an image forming apparatus that includes an image controller to output a common APC signal and the above-described semiconductor laser driver.

BRIEF DESCRIPTION OF THE DRAWINGS

A more complete appreciation of the aforementioned and other features, aspects and advantages will bet better understood by reference to the following detailed description when considered in connection with the accompanying drawings, wherein:

FIG. 10C is a timing chart illustrating APC execution timing for a semiconductor laser in the semiconductor laser drive circuit shown in FIG. 10B;

FIG. 11 is a timing chart illustrating operation in the semiconductor laser driver shown in FIG. 10A;

DETAILED DESCRIPTION OF PREFERRED EMBODIMENTS

Figure 1:
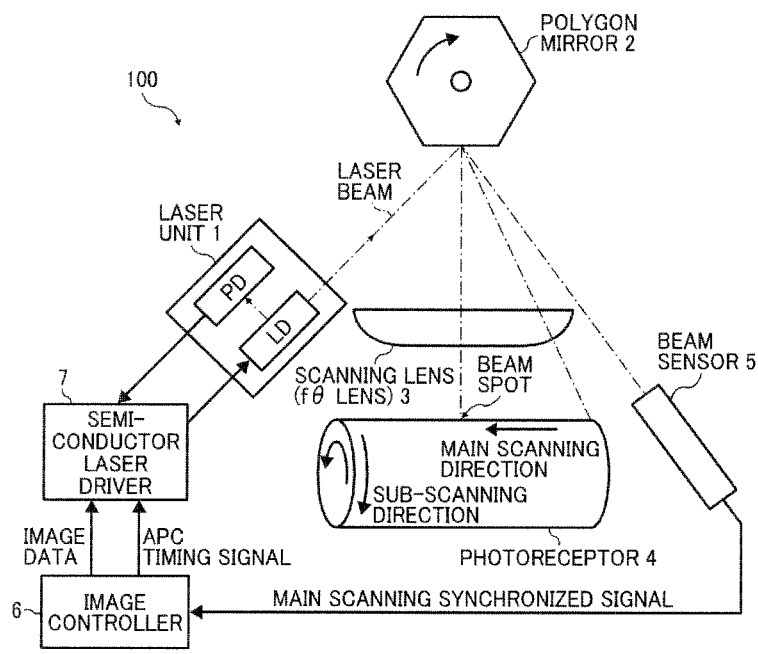
FIG. 1 is a block diagram of an image forming apparatus including a semiconductor laser driver according to present embodiments of this disclosure.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIGS. 1 and 2, a semiconductor laser driver according to an illustrative embodiment is described.

[Configuration of Image Forming Apparatus]

FIG. 1 is schematic drawing of a configuration of an image forming apparatus 100 that employs a semiconductor laser drive device 7 according to the illustrative embodiments of the present disclosure. This image forming apparatus 100 is used for image forming apparatuses using the electrophotography, for example, laser printers, and digital copiers.

The image forming apparatus 100 includes a laser unit (edge-emitting laser) 1, a polygon mirror 2, a scanning lens 3, a photoreceptor 4, a beam sensor 5, an image controller 6, and the semiconductor laser driver 7. In the image forming apparatus 100 of FIG. 1, the laser unit 1 functioning as a light source emits a laser light, and the laser light is scanned (deflected) by the polygon mirror 2 that rotates at a constant high velocity. Then, the laser light concentrates and forms a beam spot on the photoreceptor 4 (scanned medium) via the scanning lens 3 (fθ lens).

As the laser light thus deflected by the polygon mirror 2 scans and exposes the photoreceptor 4 in a main scanning direction orthogonal to a sub-scanning direction in which the photoreceptor 4 rotates, image signals are recorded with respect to each line thereof.

The beam sensor 5 is disposed at a position at which the laser beam is irradiated, that is, a position close to the one end of the photoreceptor 4, to generate a main scanning synchronized signal. The image control unit 6 generates image data and an automatic power control (APC) timing signal (common APC signal) synchronized with the main scanning synchronized signal from the laser beam sensor 5. The semiconductor laser driver 7 controls power of emission intensities of the semiconductor laser LD based on the timing of the common APC signal and cause the semiconductor laser LD to emit light synchronized with the image data.

While the semiconductor driver 7 controls the emission time of the semiconductor laser LD based on the timing of the common APC signal generated in the image control unit 6, the laser LD repeatedly emits lights and optically writes the image data D on the photoreceptor 4 in the main scanning direction in a predetermined cycle in accordance with a rotation velocity and a recording density, thus forming a latent image on a surface of the photoreceptor 4.

Generally, a laser unit of the edge-emitting laser includes a multi-beam laser that includes a single photo-receiver element (photodiode) PD in addition to multiple laser diodes LD. In the electrophotographic process using the multi-beam-laser, due to differences in transmissivity and reflectance of the lenses constructing the laser unit 1, lighting powers on the photoreceptor 4 are different even when the quantities of light (emitting amount) of the respective laser beams are identical. That is, in order to set the respective lighting powers on the photoreceptor 4 identical, the emitting amounts of the respective laser beams must be set separately.

The below described semiconductor laser drivers 7-1 through 7-13 can be adapted for the semiconductor laser driver 7 in the image forming apparatus 100 shown in FIG. 1.

[Configuration of Semiconductor Laser Driver]

First Embodiment

Figure 2:
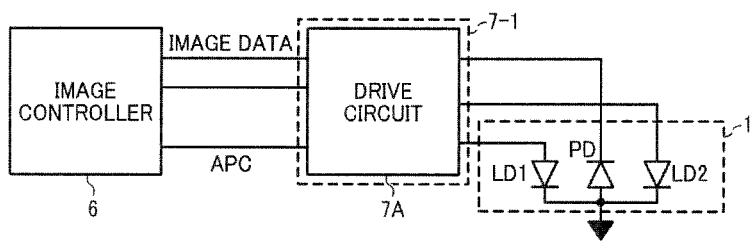
FIG. 2 is a block diagram illustrating vicinity of a semiconductor laser driver according to a first embodiment.

FIG. 2 is a block diagram illustrating a semiconductor laser driver 7-1 according to a first embodiment, the image controller 6, and the laser unit 1. The laser unit 1 is constituted by a 2LD-1PD type 2 ch multi-beam laser that includes two semiconductor lasers LD and single photodiode PD. The semiconductor laser driver 7-1 includes a semiconductor laser drive circuit 7A, serving as a drive circuit. An image-data signal line and an APC signal line are wired between the semiconductor laser drive circuit 7A and the image controller 6. The number of wiring image-data signal lines is identical to the number of semiconductor lasers LD. There is only one APC signal line through which a common APC signal is transmitted wired between the semiconductor laser drive circuit 7A and the image controller 6. The semiconductor laser driver 7-1 drives the semiconductor lasers LD1 and LD2.

Figure 3:
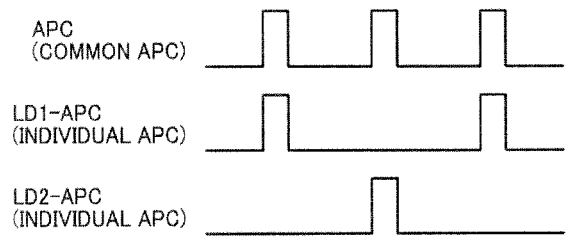
FIG. 3 is a timing chart illustrating operation in the semiconductor laser driver shown in FIG. 2.

FIG. 3 is a timing chart illustrating APC execution timing for the two semiconductor lasers LD1 and LD2. The image controller 6 outputs the APC signal (common APC signal) at a predetermined cycle. As shown in FIG. 3, the APC signal is a pulse signal, and the semiconductor laser drive circuits 7A and 7B counts the number of respective pulses of the APC signal input from the image controller 6. Herein, the number of APC signals counted is referred to as "APC count". In this state, the semiconductor laser drive circuit 7A generates an internal LD1-APC signal (individual APC signal) to execute APC for the semiconductor laser LD1 synchronized with the APC signal when the APC count is odd. The semiconductor laser drive circuit 7B generates an internal LD2-APC signal (individual APC signal) to execute APC for the semiconductor laser LD2 synchronized with the APC signal when the APC count is even. Then, the semiconductor laser driver 7-1 executes APC for the semiconductor lasers LD1 and LD2 based on the internal LD1-APC signal and the internal LD2-APC signal. More specifically, the semiconductor laser driver 7-1 executes APC in a period during which the internal LD1-APC signal or the internal LD2-APC signal is output, that is, in a period during which either the internal LD1-APC signal or the internal LD2-APC signal is high. That is, the semiconductor laser drive circuit 7A executes APC for the semiconductor laser LD1 during which the LD1-APC is high, and the semiconductor laser drive circuit 7B executes APC for the semiconductor laser LD2 during which the LD2-APC is high. As described above, in the present embodiment, APC is alternately executed for the semiconductor lasers LD1 and LD2, and both the semiconductor laser LD1 and LD2 are not under APC at the same time.

In the semiconductor laser driver 7-1 according to the present embodiment, the APC line through which the APC signal is transmitted from the image controller 6 to the semiconductor laser driver 7-1 is configured with a common architecture, which can minimize the number of lines between the image controller 6 and the semiconductor laser driver 7-1. In addition, APC can be executed for the desired semiconductor laser using a simple configuration in which the semiconductor drive circuits 7A and 7B count the number of APC signals (common signals), generate the LDn-APC (LD1-APC, LD2-APC) signals representing executing timing for the respective semiconductor lasers LD1 and LD2, and execute APC for the target semiconductor laser LD (LD1 or LD2). Therefore, the configuration of the semiconductor laser driver 7-1 is uncomplicated. In addition, the control mechanism can be simplified, thereby reducing cost.

Although the multi-beam laser of the laser unit 1 shown in FIG. 2 is a 2LD-1PD type 2ch multi-beam laser, the semiconductor laser driver 7-1 of the present embodiment can be used for a multi-beam laser that includes more than two semiconductor lasers LD and one photodiode PD. In this case, the detailed configuration will be apparent to those of skill in the art based on FIG. 2. For example, by counting the number of APC signals against a predetermined number, the internal LDn-APC signal can be generated.

In addition, the configuration of the present embodiment may be used for multiple 1LD-1PD type single-beam lasers. In this example, when two 1LD-1PD type single beam lasers are used, two photodiodes PD1 and PD2 are present instead of the single photodiode shown in FIG. 2. In this example, it is not necessary to change the timing chart from FIG. 3 for the configuration in which the two 1LD-1PD type single beam lasers are used. The same holds true for the following embodiments, described below.

Further, the multi-beam laser of the laser unit 1 is a cathode-common laser unit in which the cathode of the semiconductor laser LD and the anode of the photodiode PD are connected to a stem. It is also possible to achieve the embodiment of the multi-beam laser connection system by an anode-common laser unit in which the anode of the semiconductor laser LD and the cathode of the photodiode PD are connected to the stem. The same holds true for the following embodiments, described below. In the present embodiment, the APC signal (common APC signal) represents signals including all timings of internal LDn-APC signals. Alternatively, other APC signals can be employed as long as the internal LDn-APC signals can be generated based on the APC signal.

Second Embodiment

Next, a semiconductor laser driver 7-2 according to a second embodiment is described below with reference to FIGS. 4 and 5.

The configuration in an image forming apparatus including the semiconductor laser driver 7-2 is identical to the image forming apparatus 100 as described above, and the description is omitted. Below embodiments are similar.

The different point between the first embodiment and the second embodiment is described. In the second embodiment, as shown in FIG. 4, the semiconductor laser driver 7-2 includes two semiconductor laser drive circuits 7A and 7B that drive corresponding semiconductor lasers LD1 and LD2 in a 2LD-1PD type 2ch multi-beam laser including the two semiconductor lasers LD1 and LD2 and single photodiode PD. One end of the APC signal line and one end of a reset (RST) signal line are connected to the image controller 6. The other end of the APC signal line and the other end of the RST line bifurcate into two and the bifurcated lines are connected to the semiconductor laser drive circuits 7A and 7B, respectively. The controller 6 outputs a reset signal (RST signal) for input to the semiconductor laser drive circuit 7A and 7B, respectively. Although the RST signal is not always needed, it is efficient to synchronization among the start timings of the counting in the semiconductor laser drive circuits 7A and 7B.

Figure 5:
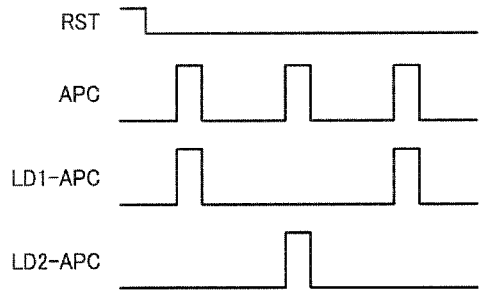
FIG. 5 is a timing chart illustrating operation in the semiconductor laser driver shown in FIG. 4.

FIG. 5 is a timing chart illustrating APC execution timing for the two semiconductor lasers LD. The image controller 6 outputs the APC signal at a predetermined cycle and the APC signal is input to the semiconductor laser drive circuits 7A and 7B. The semiconductor laser drive circuits 7A and 7B count the number of output APC signals after the RST signal is input. The semiconductor laser drive circuit 7A outputs the internal LD1-APC signal, synchronized with the APC signal when the APC count is odd after the RST signal is input. The semiconductor laser drive circuit 7B outputs the internal LD2-APC signal, synchronized with the APC signal when the APC count is even after the RST signal is input. Then, the semiconductor laser drive circuits 7A and 7B execute APC for the semiconductor lasers LD1 and LD2 based on the internal LD1-APC signal and the internal LD2-APC signal, respectively. In the above-described configuration of the second embodiment, APC is alternately executed for the semiconductor lasers LD1 and LD2, both semiconductor lasers LD1 and LD2 are not under APC at the same time.

In the semiconductor laser driver 7-2 according to the present embodiment, the APC line through which the APC signal is transmitted from the image controller 6 to the semiconductor laser driver 7-2 is configured with a common architecture, which can minimize the number of lines between the image controller 6 and the semiconductor laser driver 7-2. In addition, APC can be executed for the desired semiconductor laser using a simple configuration in which the semiconductor drive circuits 7A and 7B count the number of APC signals (common signal), generate the LDn-APC (LD1-APC, LD2-APC) signals representing executing timing for the respective semiconductor lasers LD1 and LD2, and execute APC for the target semiconductor laser LD (LD1 or LD2). Therefore, the configuration of the semiconductor laser driver 7-1 can be is uncomplicated. In addition, the control mechanism can be simplified, thereby reducing cost.

Figure 4:
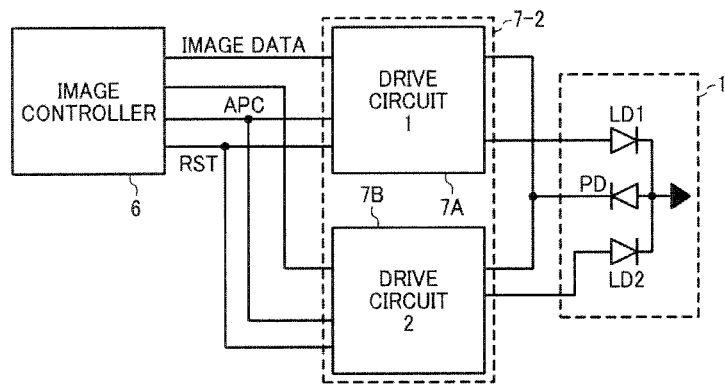
FIG. 4 is a block diagram illustrating vicinity of a semiconductor laser driver according to a second embodiment.

Although the multi-beam laser of the laser unit 1 shown in FIG. 4 is the 2LD-1PD type 2ch multi-bam laser, the present semiconductor laser driver 7-2 can be used for a multi-beam laser that includes more than two semiconductor lasers LD and one photodiode PD. In this case, the detailed configuration will be apparent to those of skill in the art based on FIG. 4, and the description thereof is omitted.

Third Embodiment

Next, a semiconductor laser driver 7-3 according to a third embodiment is described below with reference to FIGS. 6 and 7.

Figure 6:
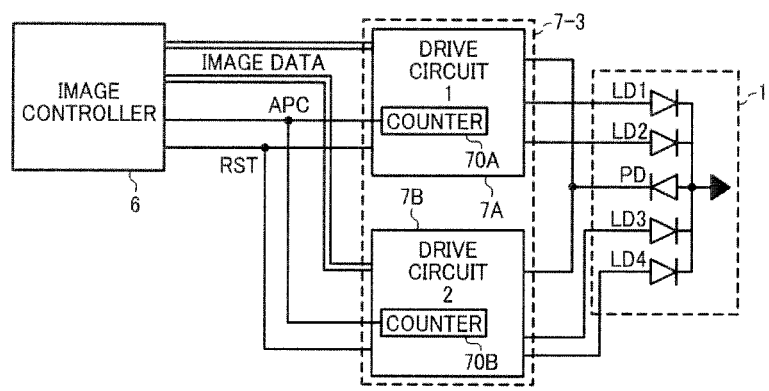
FIG. 6 is a block diagram illustrating vicinity of a semiconductor laser driver according to a third embodiment.

In the third embodiment, as shown in FIG. 6, the semiconductor laser driver 7-3 includes two semiconductor laser drive circuits 7A and 7B. The semiconductor laser drive circuits 7A and 7B drive a 4LD-1PD type 4ch multi-beam laser including four semiconductor lasers LD (LD1, LD2, LD3, and LD4) and single photodiode PD. The semiconductor laser drive circuit 7A drives the semiconductor lasers LD1 and LD2, and the semiconductor laser drive circuit 7B drives the semiconductor lasers LD3 and LD4. The semiconductor laser drive circuit 7A includes a counter 70A, and the semiconductor laser drive circuit 7B includes a counter 70B.

Figure 7:
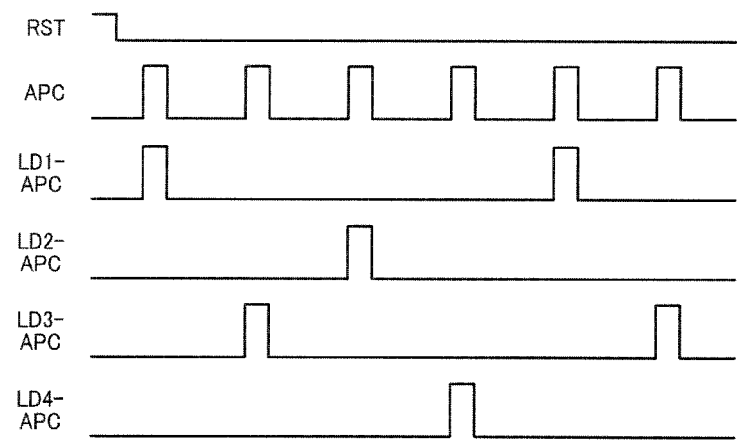
FIG. 7 is a timing chart illustrating operation in the semiconductor laser driver shown in FIG. 6.

FIG. 7 is a timing chart illustrating APC execution timing for the four semiconductor lasers LD. The image controller 6 outputs the APC signal at a predetermined cycle and output the RST signal at a predetermined timing. The APC signal and the RST signal from the image controller 6 are input to the semiconductor laser drive circuits 7A and 7B. The semiconductor laser drive circuit 7A and 7B count the output number of APC signals after the RST signal is output. When the APC count (the number of APC signals counted) is "4n+1 (n=0, 1, 2 . . . )", the semiconductor laser drive circuit 7A generates the internal LD1-APC signal and executes APC for the semiconductor laser LD1. When the APC count is "4n+3", the semiconductor laser drive circuit 7A generates the internal LD2-

APC signal and executes APC for the semiconductor laser LD2. When the APC count is "4n+2", the semiconductor laser drive circuit 7B generates the internal LD3-APC signal and executes APC for the semiconductor laser LD3. When the APC count is "4n+4", the semiconductor laser drive circuit 7B generates the internal LD4-APC signal and executes APC for the semiconductor laser LD4. In the third embodiment, APC is executed in a different timing among the semiconductor lasers LD1, LD2, LD3, and LD4, and APC is not executed for the respective semiconductor lasers LD1, LD2, LD3, and LD4 at the same time. That is, APC can be executed for the respective semiconductor lasers LD at timings that do not overlap.

Although the multi-beam laser of the laser unit 1 shown in FIG. 6 is the 4LD-1LD type 4ch multi-beam laser that includes four semiconductor lasers LD and single photodiode PD, the configuration of the third embodiment can be adapted for a multi-beam laser including more than four semiconductor laser LD and one photodiode PD. In this case, the detailed configuration will be apparent to those of skilled in the art base on FIG. 6, and the description thereof is omitted.

Fourth Embodiment

Next, a semiconductor laser driver 7-4 of a fourth embodiment is described below with reference to FIG. 8.

Figure 8:
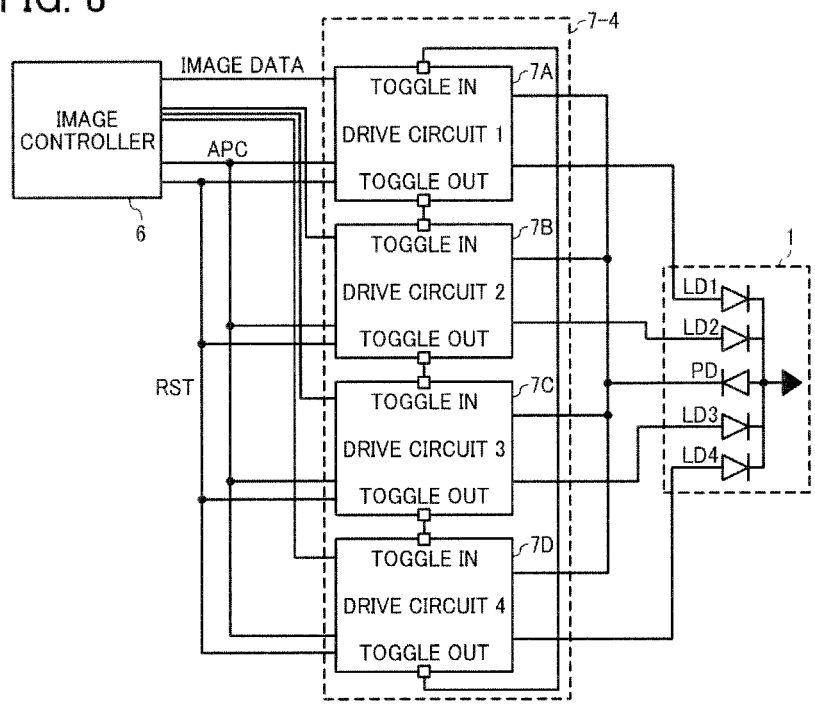
FIG. 8 is a block diagram illustrating vicinity of a semiconductor laser driver according to a fourth embodiment.

In the fourth embodiment as shown in FIG. 8, the semiconductor laser driver 7-4 includes four semiconductor laser drive circuits 7A, 7B, 7C, and 7D. The semiconductor laser drive circuits 7A, 7B, 7C, and 7D drive a 4LD-1PD type 4 ch multi-beam laser including four semiconductor lasers LD (LD1, LD2, LD3, and LD4) and one photodiode PD. The semiconductor laser drive circuit 7A drives the semiconductor laser LD1, the semiconductor laser drive circuit 7B drives the semiconductor laser LD2, the semiconductor laser drive circuit 7C drives the semiconductor laser LD3, and the semiconductor laser drive circuit 7D drives the semiconductor laser LD4.

Each of the semiconductor laser drive circuits 7A, 7B, 7C, and 7D includes a toggle output terminal through which a toggle signal indicating that APC has been executed for the target semiconductor lasers LD1, LD2, LD3, and LD4 is output to a next stage of the semiconductor laser drive circuit (7B, 7C, 7D, and 7A), and a toggle input terminal through which the toggle signal output from a previous stage of the semiconductor laser drive circuit (7D, 7A, 7B, and 7C) is input. In the present embodiment, the toggle output terminal of the semiconductor laser drive circuit 7A is connected to the toggle input terminal of the semiconductor laser drive circuit 7B. The toggle output terminal of the semiconductor laser drive circuit 7B is connected to the toggle input terminal of the semiconductor laser drive circuit 7C. The toggle output terminal of the semiconductor laser drive circuit 7C is connected to the toggle input terminal of the semiconductor laser drive circuit 7D. The toggle output terminal of the semiconductor laser drive circuit 7D is connected to the toggle input terminal of the semiconductor laser drive circuit 7A. It is to be noted that a connection order of the semiconductor laser circuit 7A, 7B, 7C, and 7D shown in FIG. 8 is just one example, the respective semiconductor laser circuits 7A, 7B, 7C, and 7D may be connected in the order in which APC is executed for the desired semiconductor lasers LD. Further, in this embodiment, each of the semiconductor laser drive circuits 7A, 7B, 7C, and 7D drives corresponding one semiconductor laser LD, the present connection configuration can be used for a configuration in which the single semiconductor laser drive circuit drive two semiconductor lasers LD. In this case, the detailed configuration will be described blow as a sixth embodiment with reference to FIGS. 10A and 11.

Figure 9:
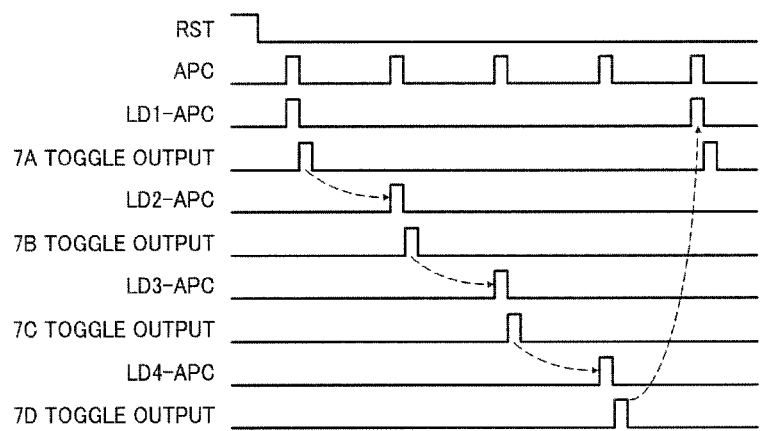
FIG. 9 is a timing chart illustrating operation in the semiconductor laser driver shown in FIG. 8.

FIG. 9 is a timing chart illustrating APC execution timing for the four semiconductor lasers LD. The image controller 6 outputs the APC signal at a predetermined cycle and output the RST signal at a predetermined timing. The APC signal and the RST signal from the image controller 6 are input to the semiconductor laser drive circuits 7A through 7D respectively. When the semiconductor laser drive circuit 7A receives an initial APC signal after the RST signal is received, the semiconductor laser drive circuit 7A generates the internal LD1-APC signal synchronized with the APC signal, executes APC timed to coincide with the output of the internal LD1-APC signal, and then outputs the toggle signal after APC has been executed. When the semiconductor laser drive circuit 7B receives the APC signal after receiving the toggle signal from the semiconductor laser drive circuit 7A, the semiconductor laser drive circuit 7B generates the internal LD2-APC signal synchronized with the APC signal, executes APC for the semiconductor laser LD2 timed to coincide with the output of the internal LD3-APC signal, and then outputs the toggle signal after APC has been executed. When the semiconductor laser drive circuit 7C receives the APC signal after receiving the toggle signal from the semiconductor laser drive circuit 7B, the semiconductor laser drive circuit 7C generates the internal LD3-APC signal synchronized with the APC signal, executes APC for the semiconductor laser LD3 timed to coincide with the output of the internal LD3-APC signal, and then outputs the toggle signal after APC has been executed. When the semiconductor laser drive circuit 7D receives the APC signal after receiving the toggle signal from the semiconductor laser drive circuit 7C, the semiconductor laser drive circuit 7D generates the internal LD4-APC signal synchronized with the APC signal, executes APC for the semiconductor laser LD4 timed to coincide with the output of the internal LD4-APC signal, and then outputs the toggle signal after APC has been executed. When the semiconductor laser drive circuit 7A receives the APC signal after receiving the toggle signal from the semiconductor laser drive circuit 7D, the semiconductor laser drive circuit 7A generates the internal LD1-APC signal synchronized with the APC signal, executes APC for the semiconductor laser LD4 timed to coincide with the output of the internal LD1-APC signal, and then outputs the toggle signal after APC has been executed. Then, above-described processes are repeated.

It is to be noted that the toggle signal (toggle output signal) is output immediately after APC has been executed in the present operation shown in FIG. 9, the toggle signal can be output under APC, or at a timing at which a predetermined time has elapsed after APC has been executed. Thus, by only exchanging the toggle signals among the semiconductor laser drive circuits 7A, 7B, 7C, and 7D, the control operation of the multiple semiconductor laser drive circuits can be simplified by using single APC signal.

Fifth Embodiment

Next, a semiconductor laser driver according to a fifth embodiment is described below.

The circuit configuration of the fourth embodiment (see FIG. 8) may be not clear the semiconductor laser LD from which APC is started. In order to achieve better result, in the fifth embodiment, the semiconductor laser from which APC is started is externally settable, or the drive circuit from which APC is started is externally settable. For example, the image controller 6 directs that APC is started from the semiconductor laser drive circuit 7A that drives the semiconductor laser LD1. In this case, by setting external terminal, the semiconductor laser drive circuit 7A is set as a master drive circuit that executes APC initially based on the initial APC signal. When the initial APC signal is input after inputting the RST signal, the semiconductor drive circuit 7A starts executing APC.

Sixth Embodiment

Next, a semiconductor laser driver 7-6 according to a sixth embodiment is described below with reference to FIGS. 10A through 11.

Figure 10A:
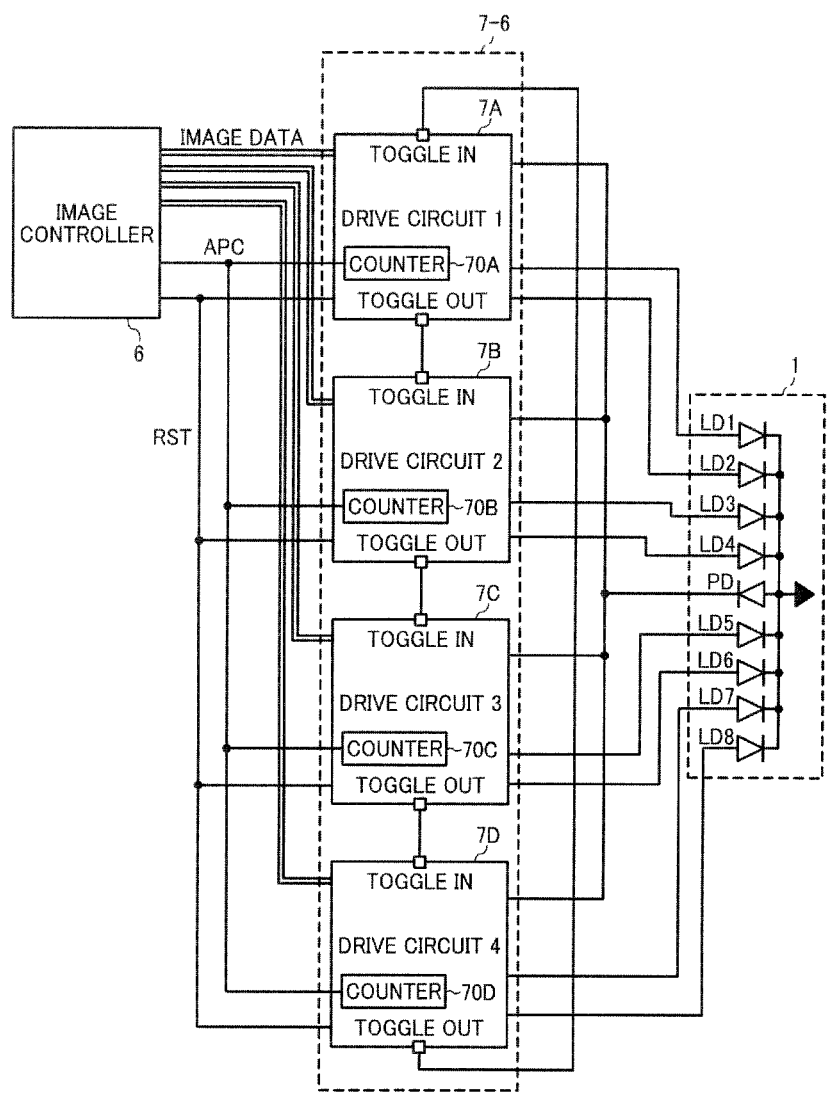
FIG. 10A is a block diagram illustrating vicinity of a semiconductor laser driver according to a sixth embodiment.

In the sixth embodiment as shown in FIG. 10A, the semiconductor laser driver 7-6 includes four semiconductor laser drive circuits 7A, 7B, 7C, and 7D. The semiconductor laser drive circuits 7A, 7B, 7C, and 7D drive a 8LD-1PD type 8 ch multi-beam laser including eight semiconductor lasers LD and one photodiode PD. The semiconductor laser drive circuit 7A drives the semiconductor lasers LD1 and LD2. The semiconductor laser drive circuit 7B drives the semiconductor lasers LD3 and LD4. The semiconductor laser drive circuit 7C drives the semiconductor lasers LD5 and LD6. The semiconductor laser drive circuit 7D drives the semiconductor lasers LD7 and LD8.

The respective semiconductor laser drive circuits 7A, 7B, 7C, and 7D include counters 70A, 70B, 70C, and 70D that count the number of APC signals. Each of the semiconductor laser drive circuits 7A, 7B, 7C, and 7D executes APC for the corresponding the semiconductor lasers LD1 through LD8 against a predetermined count number. Each of the semiconductor laser drive circuits 7A, 7B, 7C, and 7D executes APC when a corresponding toggle signal has been input and the number of APC signals counted (APC count) reaches a predetermined count number. Thus, APC can be executed for the respective semiconductor lasers LD at timings that do not overlap.

Herein, one example of an internal configuration of the semiconductor laser drive circuit and operation thereof is described below with reference to FIGS. 10B and 10C.

Figure 10B:
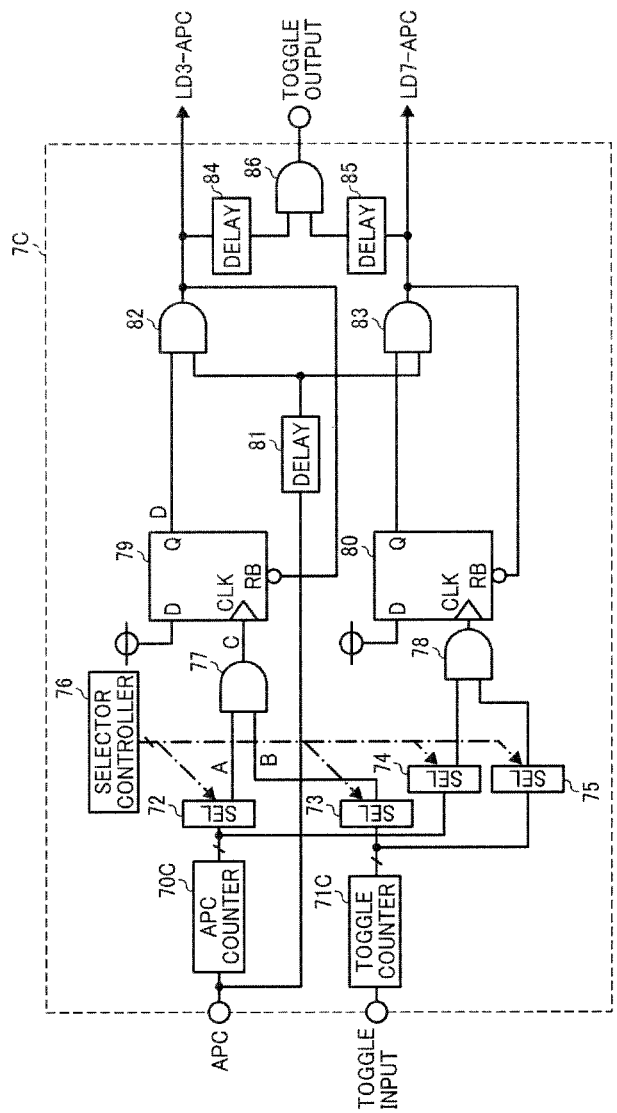
FIG. 10B is a configuration diagram illustrating one example of an internal structure of a semiconductor laser drive circuit included in the semiconductor laser driver shown in FIG. 10A.

FIG. 10B is a configuration diagram illustrating one example of an internal structure of the semiconductor laser drive circuit 7C included in the semiconductor laser driver 7-6. The semiconductor laser drive circuit 7C includes the APC counter 70C, a toggle counter 71C, selectors 72, 73, 74, and 75, a selector controller 76, AND circuits 77, 78, 82, and 83, D-type flip-flop (D-FF) circuits 79 and 80, delay circuits 81, 84 and 85, and an OR circuit 86. The D-FF circuits 79 and 80 are latch circuits. The selector controller 77 controls data of a count output value for a predetermined count number, the selectors 72 and 74 select the APC signals counted in the APC counter 70C and the selector 73 and 75 select the toggle signal counted in the toggle input counter 71C.

FIG. 10C is a timing chart illustrating APC execution timing for the semiconductor laser LD3 connected to the semiconductor laser drive circuit 7C. In the control of the semiconductor laser LD3, when the APC count (the number of common APC signals) reaches a predetermined count number (8n+3) in the APC counter 70C, the selector 73 selects the APC signal from the APC counter 70C and outputs the APC signal (signal A) to the AND circuit 77. In addition, when the toggle signal is input to the toggle counter 71C at the predetermined counted number, the selector 72 selects toggle counter 71C and outputs the toggle signal (signal B) to the AND circuit 77. The AND circuit 77 outputs a signal C as a clock signal during which both signals A and B are input. In the D-FF circuit 79, when the clock signal (signal C) is input from the AND circuit 77, an output signal D from an output terminal Q thereof is latched (kept) high. Then, when an output terminal RB becomes low, the output signal D becomes low. After the APC-LD3 signal is selected and the APC is executed for the semiconductor laser LD3, the D-FF circuit 79 is reset.

It is to be noted that, although the selector controller 76 are provided in the semiconductor laser drive circuit 7C, the selector controller may be provided outside of the semiconductor laser drive circuit 7C. In addition, the semiconductor laser drive circuits 7A through 7D in the semiconductor laser driver 7-6 including the toggle input terminals and the toggle output terminals are not limited to the details of internal configuration described above, but various modifications and improvements are possible without departing from the spirit and scope of the present procedure.

FIG. 11 is a timing chart illustrating APC execution timing for the eight semiconductor lasers LD connected to the semiconductor laser driver 7-6 shown in FIG. 10A. The image controller 6 outputs the APC signal at a predetermined cycle and outputs the RST signal at a predetermined timing. The APC signal and the RST signal from the image controller 6 are input to the semiconductor laser drive circuits 7A through 7D. When the semiconductor laser drive circuit 7A receives the initial APC signal after receiving the RST signal and the APC count (the number of common APC signals) reaches a predetermined count number (8n+1), the semiconductor laser drive circuit 7A generates the internal LD1-APC signal synchronized with the APC signal, executes APC, and then outputs the toggle signal after APC has been executed. When the semiconductor laser drive circuit 7B receives the APC signal after receiving the toggle signal output from the semiconductor laser drive circuit 7A and the APC count reaches a predetermined count number (8n+2), the semiconductor laser drive circuit 7B generates the internal LD3-APC signal synchronized with the APC signal, executes APC for the semiconductor laser LD3, and then outputs the toggle signal after APC has been executed. When the semiconductor laser drive circuit 7C receives the APC signal after receiving the toggle signal output from the semiconductor laser drive circuit 7B and the APC count reaches a predetermined count number (8n+3), the semiconductor laser drive circuit 7C generates the internal LD5-APC signal synchronized with the APC signal, executes APC for the semiconductor laser LD5, and then outputs the toggle signal after APC has been executed. When the semiconductor laser drive circuit 7D receives the APC signal after receiving the toggle signal output from the semiconductor laser drive circuit 7C and the APC count reaches a predetermined count number (8n+4), the semiconductor laser drive circuit 7D generates the internal LD7-APC signal synchronized with the APC signal, executes APC for the semiconductor laser LD7, and then outputs the toggle signal after APC has been executed. When the semiconductor laser drive circuit 7A receives the APC signal after receiving the toggle signal output from the semiconductor laser drive circuit 7D and the APC count reaches a predetermined count number (8n+5), the semiconductor laser drive circuit 7A generates the internal LD2-APC signal synchronized with the APC signal, executes APC for the semiconductor laser LD2, and then outputs the toggle signal after APC has been executed. Subsequently, the semiconductor laser drive circuits 7B through 7D similarly execute APC for the semiconductor lasers LD4, LD6, and LD8. Once APC execution for the semiconductor laser LD8 is completed, APC is executed from semiconductor laser LD1 again in the above-described order.

It is to be noted that, although APC is executed for the semiconductor lasers in the order LD1, LD3, LD5, LD7, LD2, LD4, LD6, LD8, the order in which APC is executed for the semiconductor lasers LD can be changed freely by changing the connection destination of the toggle signals and by changing the set predetermined count number. For example, in the semiconductor laser drive circuit 7A, although the toggle signal is output to the semiconductor laser driver 7B after APC for the semiconductor laser LD1 has been executed as shown in FIG. 11, the toggle signal may be output to the to the semiconductor laser driver 7B after APC for the semiconductor laser LD1 and subsequent APC for the semiconductor laser LD2 have been executed. In this case, similarly to the semiconductor laser drive circuit 7A, the semiconductor laser drive circuits 7B, 7C, and 7D output the toggle signals after APC for the semiconductor lasers connected to the respective semiconductor laser drive circuits 7B, 7C, and 7D are executed entirely. In this configuration, APC is executed for the semiconductor lasers in order of LD1, LD2, LD3, LD4, LD5, LD6, LD7, and LD8.

Seventh Embodiment

Next, a semiconductor laser driver 7-7 according to a seventh embodiment is described below with reference to FIG. 12.

In this embodiment, a configuration in which APC can be further executed when noise arises in the APC signal line or the toggle signal in a circuit block configuration of the semiconductor laser driver 7-6 of the sixth embodiment shown in FIG. 10A. FIG. 12 is a timing chart in the block diagram shown in FIG. 10A corresponding to the timing chart shown in FIG. 11.

Figure 12:
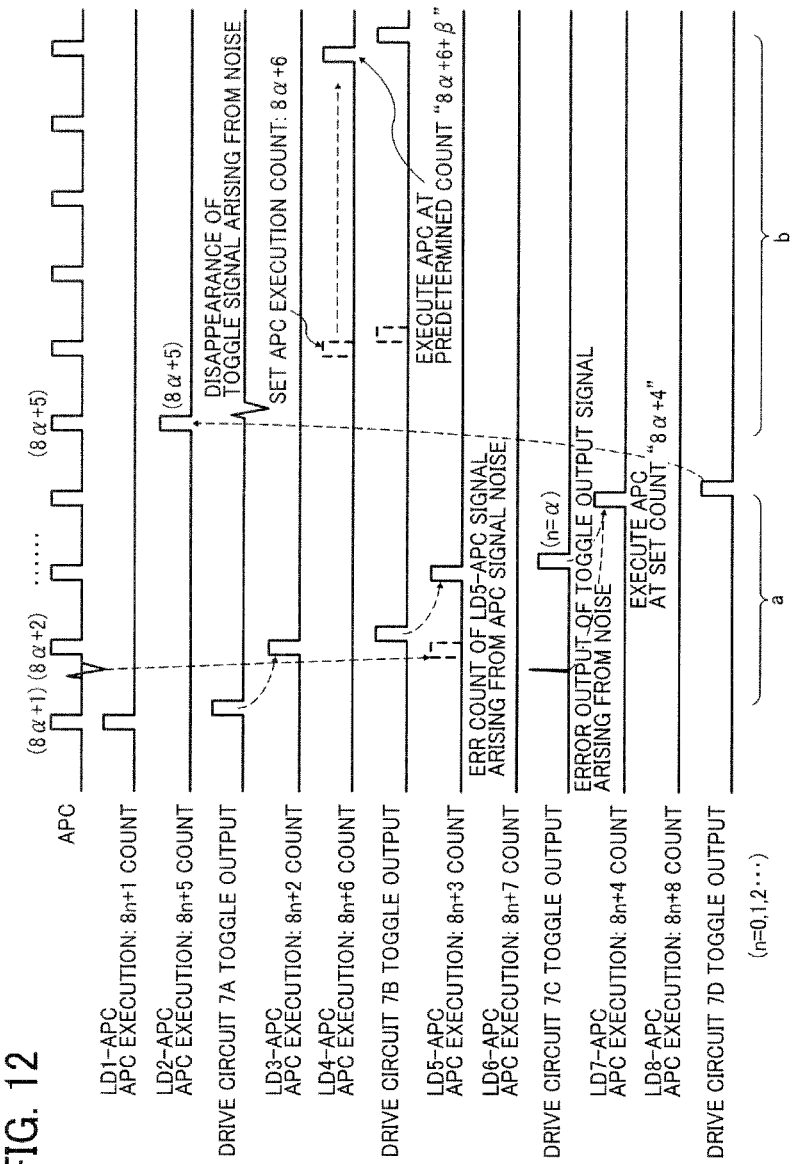
FIG. 12 is a timing chart illustrating operation in a semiconductor laser driver according to a seventh embodiment.

A portion representing "a" in FIG. 12 represents that, when noise arises in the APC signal line at a time period between $8\alpha+1$ count to $8\alpha+2$ count, the semiconductor laser drive circuit 7C counts the noise in addition to the APC signal pulse and mistakenly counts the APC count (number of APC signals) for a count that is one count greater than an actual APC count. In the case in which this count mistake has occurred, in the present embodiment of FIG. 12, although the count number of LD-5-APC signals for the semiconductor laser LD5 connected to the semiconductor laser drive circuit 7C is equal to the count number of LD3-APC signals for the semiconductor laser LD3 connected to the semiconductor laser drive circuit 7B, APC is executed in the semiconductor laser drive circuit 7B at a predetermined $8\alpha+2$ count of the APC count because the semiconductor laser drive circuit 7B receives the toggle signal from the semiconductor laser drive circuit 7A; by contrast, APC is not executed in the semiconductor laser drive circuit 7C at the predetermined $8\alpha+2$ count because the semiconductor laser drive circuit 7C does not receive the toggle signal. Subsequently, APC is executed for the semiconductor laser LD5 at a predetermined $8\alpha+3$ count in the semiconductor laser drive circuit 7C after the semiconductor laser drive circuit 7C receives the input toggle signal that directs that APC has been executed for the semiconductor laser LD3 connected to the semiconductor laser drive circuit 7B.

Namely, in a case in which the counter (70C) in a target semiconductor drive circuit (7C) mistakenly counts a noise and mistakenly counts a previous stage of predetermined count number ($8\alpha+2$) of common APC signals for a target predetermined count number ($8\alpha+3$), the target semiconductor laser drive circuit (7C) generates the individual APC signal after the toggle signal is input from the previous stage of the semiconductor laser drive circuit (7B) and executes APC based on the individual APC signal (LD5-APC signal).

In another case, in a case in which a noise arises in the toggle signal line connected between the semiconductor laser drive circuit 7C and the semiconductor laser drive circuit 7D during a period between $8\alpha+1$ count and $8\alpha+2$ count of APC signal, the semiconductor laser drive circuit 7D mistakenly recognizes that APC may have been already executed in the semiconductor laser drive circuit 7C. In the present embodiment, even when the above-described noise arises in the toggle signal line, APC is not executed in the semiconductor laser drive circuit 7D unless the internal APC count of the semiconductor laser drive circuit 7D reaches a predetermined "$8\alpha+4$" count. Accordingly, executing APC for both semiconductor lasers LD5 and LD7 at the same time can be avoided.

Namely, in a case in which the toggle signal is input to the semiconductor laser drive circuit (7D) before the APC count reaches a predetermined count number ($8\alpha+4$), the semiconductor laser drive circuit (7D) generates the LD7-APC signal (individual APC signal) after APC count reaches the predetermined count number ($8\alpha+4$) and executes APC based on the LD7-APC signal.

In yet another case, "disappearance of signal arising from noise" in FIG. 12 represents that, although the toggle signal is output from the semiconductor laser drive circuit 7A after APC has been executed for the semiconductor laser LD2 connected to the semiconductor laser drive circuit 7A, the toggle signal is disappeared by some external factor at a predetermined "$8\alpha+5$" counts of the APC signal, and as a result, the semiconductor laser drive circuit 7B cannot receive the toggle signal. In the case in which the toggle signal is disappeared, the semiconductor laser drive circuit 7B cannot recognize that APC has been executed for the semiconductor laser LD2 connected to the semiconductor laser drive circuit 7A. Accordingly, when the APC count execution count reaches a predetermined "$8\alpha+6$" count, APC is not executed for the semiconductor laser LD4 connected to the semiconductor laser drive circuit 7B unless the toggle signal is input to the semiconductor laser drive circuit 7B. Then, APC is not executed for the semiconductor lasers LD6, LD8, LD1, . . . , execution of APC in the entire system may be stopped.

In an effort to counteract the above-described problem, in the present embodiment, in the case in which a target semiconductor laser drive circuit (7B show in FIG. 12) does not receive the toggle signal from a previous stage of the semiconductor laser drive circuit (7A shown in FIG. 12) even when the APC count reaches a predetermined set count "x", and further, the toggle signal is not input even when the APC count reaches a predetermined count "y" (differ from "x") set in advance after the APC count reaches a predetermined count "x", the target semiconductor laser drive circuit (7B) recognizes that the toggle signal output from the previous stage of the semiconductor laser drive circuit (7A) is disappeared and executes APC at the timing when the counter 70B counts the predetermined count number "y". For example, as shown in a "b" portion in FIG. 12, in a state in which the target semiconductor laser drive circuit 7B does not receives the toggle signal even when the APC count reaches a predetermined count "$8\alpha+6$" and further does not the toggle signal even when the APC count reaches a predetermined count "$8\alpha+6+\beta$" that is set in advance, the semiconductor laser drive circuit 7B recognizes that the toggle signal output from the semiconductor laser drive circuit 7A is disappearance and executes APC at the predetermined "$8\alpha+6+\beta$" count of APC signals. Thus, stopping APC execution in the entire system can be prevented. In this case, the counter 70B in the semiconductor laser drive circuit 7B is reset and then begins counting the APC signal and the semiconductor laser drive circuit 7D executes APC per each eighth count. It is to be noted that the semiconductor laser drive circuit 7C, 7D, are 7A are controlled by similar control procedures as described above.

With this configuration, even when false operation arising from the noises, the operation of the APC execution can be returned smoothly.

Namely, in the present configuration, in a case in which the toggle signal is not input to the semiconductor laser drive device (7B) even when the APC count reaches a first predetermined count number ($8\alpha+6$), the semiconductor laser drive circuit (7B) generates the LD4-APC signal (individual APC signal) when a predetermined second count ($\beta$) is elapsed after the APC count reaches the first predetermined count number ($8\alpha+6$) and executes APC based on the LD4-APC signal.

Eighth Embodiment

Next, a semiconductor laser driver 7-8 according to an eighth embodiment is described below.

Similarly to the first through seventh embodiments, in the present embodiment, when APC is executed for the one semiconductor laser LD, it is necessary to turn off other semiconductor lasers LD. In order to turn off the semiconductor laser LD, it is necessary for respective output currents from the semiconductor laser driver 7-6 to control and set smaller than an oscillation threshold current Ith. Although error of a light-emission amount is small when the output current is below the oscillation threshold current Ith, in order to eliminate self-emission when the output current is smaller than the oscillation threshold current Ith, it is preferable that the drive current be set to zero. In configurations of the first through seventh embodiments, the semiconductor laser drive circuits recognize timing at which APC should be started executing based on the APC count and the toggle signal. In addition, the semiconductor laser drive circuits recognize whether or not APC is executed for other semiconductor lasers LD based on the APC signal. Thus, multiple semiconductor laser LD are controlled such that other semiconductor laser LD is (are) off state when APC is executed for one (target) semiconductor laser LD. Therefore, the error of the light-emission amount arising from APC execution for other semiconductor laser when APC is executed for the target semiconductor lasers LD can be reduced.

Figure 13:
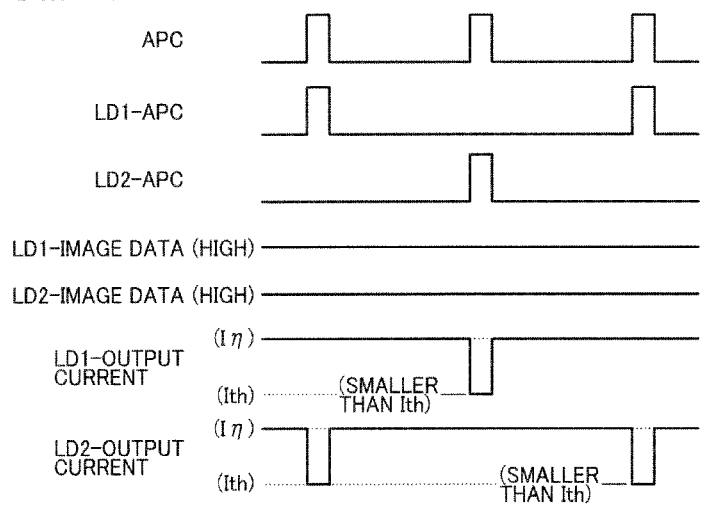
FIG. 13 is a timing chart illustrating operation in a semiconductor laser driver according to a ninth embodiment.

FIG. 13 is a timing chart illustrating APC execution timing corresponding to the block diagram of the semiconductor laser driver 7-1 shown in FIG. 2. The image controller 6 outputs the APC signal at a predetermined cycle. The APC signal from the image controller 6 is input to the semiconductor laser drive circuit 7A, and the semiconductor laser drive circuit 7A alternately executes APC for the semiconductor lasers LD1 and LD2. At this time, the image data to direct that both semiconductor lasers LD1 and LD2 be on state is input to the semiconductor laser drive circuit 7A. That is, regardless of the execution of APC, the semiconductor lasers LD1 and LD2 are on state. In a state in which the both the semiconductor lasers LD1 and LD are on, for example, when APC is executed for the semiconductor laser LD1, by summing up the light-emission amount (emission current (I$\eta$)) of the semiconductor lasers LD1 and LD2, the drive current reaches the oscillation threshold current Ith, and a monitor current for the photodiode PD is generated. Namely, APC cannot be executed correctly for the semiconductor laser LD1. In order to solve this problem, in the present embodiment, when APC is executed for the semiconductor laser LD1, by setting the current flowing to the semiconductor laser LD2 smaller than the oscillation threshold current Ith, the semiconductor laser LD2 is turned off. Thus, the light-emission amount of the other semiconductor laser LD2 becomes no influence on the light-emission amount of the semiconductor laser LD1 during which APC is executed for the semiconductor laser LD1. Similar operation is performed when APC is executed for the semiconductor laser LD2.

That is, when the semiconductor laser driver 7-8 executes APC for one of the multiple semiconductor lasers, the semiconductor laser drive circuit causes a current flowing through the other of multiple semiconductor lasers to be set smaller than the oscillation threshold current Ith (including 0 mA).

Ninth Embodiment

Next, a semiconductor laser driver 7-9 according to a seventh embodiment is described below.

The configuration of the present embodiment can be adapted for the semiconductor laser drivers 7-1 through 7-8. In the present configuration, when APC is executed with count, the order of execution of APC can be set externally. More specifically, which one of the semiconductor laser LD and which count of the APC signals should be executed is externally settable. Therefore, the order of the execution of APC can be changed freely. The setting from external can be executed similar to the procedure described in the fifth embodiment.

Tenth Embodiment

Figure 14:
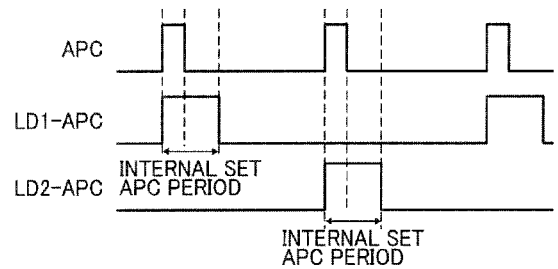
FIG. 14 is a timing chart illustrating operation in a semiconductor laser driver according to a tenth embodiment.

Next, a semiconductor laser driver 7-10 according to a tenth embodiment is described below with reference to FIG. 14. FIG. 14 is a timing chart illustrating APC execution timing corresponding to the block diagram of FIG. 2. Although the semiconductor laser driver 7-1 through 7-9 according to the above-described embodiments execute APC in a period that is a same period during which the APC signal from the image controller 6 is generated, in the present embodiment, the semiconductor laser driver 7-10 detects a rising edge of the APC signal supplied from the image controller 6 and then executes APC for the semiconductor lasers within a predetermined time period set in advance based on the rising edge, as shown in FIG. 14.

It is to be noted that the predetermined time period after detection of the rising edge of APC signal may be externally changed. The external settings can be performed similarly to the control procedure as described in the fifth embodiment.

Eleventh Embodiment

Next, a semiconductor laser driver 7-11 according to an eleventh embodiment is described below.

Although, above-described embodiments, the semiconductor laser drivers 7-1 through 7-10 execute APC for only one semiconductor laser LD to which the APC signal is supplied from the image controller 6, in a case in which the multi-beam laser is not used, APC can be executed for multiple semiconductor lasers LD per APC signal one time (at the same time).

Twelfth Embodiment

Next, a semiconductor laser driver 7-12 according to a twelfth embodiment is described below with reference to FIG. 15.

Figure 15:
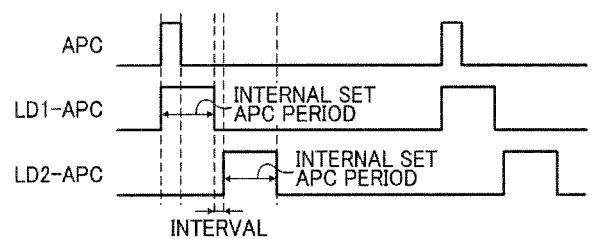
FIG. 15 is a timing chart illustrating operation in a semiconductor laser driver according to a twelfth embodiment.

FIG. 15 is a timing chart illustrating APC execution timing corresponding to the block diagram of FIG. 2. Although each of the semiconductor laser drivers 7-1 through 7-10 according to the above-described embodiments execute APC for only one semiconductor laser LD when the APC signal is supplied from the image controller 6, in the present embodiment, when the APC signal is supplied at once, APC is executed for the multiple the semiconductor lasers LD continuously at set intervals in the order set in advance. That is, as shown in FIG. 15, when the APC signal from the image controller 6 is input to the drive circuit (7A), the drive circuit 7A continuously executes APC for the semiconductor lasers LD1 and LD2 at a predetermined interval.

It is to be noted that the order of execution of the semiconductor laser LD, a period of execution of APC, the set interval can be externally changed freely. The external setting can be performed as the control procedure as described in the fifth embodiment.

Thirteenth Embodiment

Next, a semiconductor laser driver 7-13 according to a thirteenth embodiment is described below with reference to FIGS. 16 and 17.

The configuration of the present embodiment can be used for the semiconductor laser drivers 7-3, 7-6, 7-7 shown in FIGS. 6 and 10A that includes multiple drive circuits (7A and 7B) (7A, 7B, 7C, and 7D), and each of the semiconductor drive circuit (7A, 7B) (7A, 7B, 7C, and 7D) includes the counter (70A and 70B) (70A, 70B, 70C, and 70D) to count the number of APC signals and drives the multiple semiconductor lasers (LD1, LD2, LD3, and LD4) (LD, LD2, LD3, LD4, LD5, LD6, LD7, and LD8) connected thereto. In a configuration of the present embodiment, a count start timing of counters are set such that the semiconductor laser drive circuit 7A executes APC for the semiconductor laser LD1 when the initial APC signal is input after receiving the RST signal, in a state in which the RST signal is input to each of the semiconductor laser drive circuits, when the initial APC signal is input after the RST signal is input. By setting the count start timing in the counter, the APC can be started in the entire system without error operation. Thus, APC is executed smoothly as follow procedure.

Figure 16:
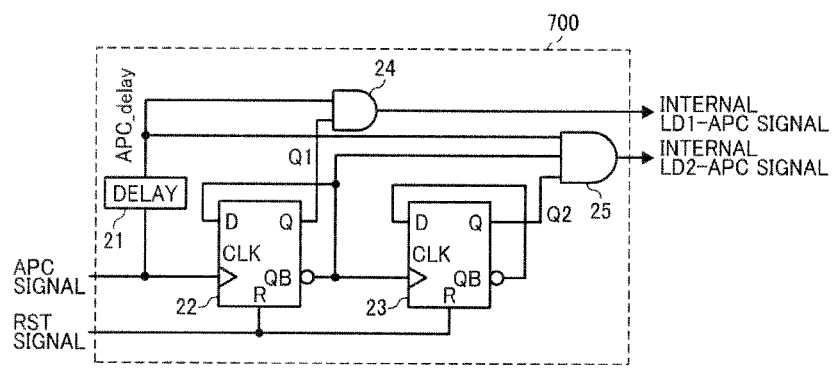
FIG. 16 is a configuration diagram illustrating an example of a non-synchronized type counter included in a semiconductor laser driver according to a thirteenth embodiment.

FIG. 16 is circuitry illustrating one example of a non-synchronous counter 700 that uses an APC counter and the APC signal. The non-synchronous counter 700 includes a delay circuit 21, first and second D-type flip-flop with reset 22 and 23, and first and second AND circuits 24 and 25.

The delay circuit 21 delays the timing of the input APC signal at predetermined time period and outputs the delayed APC signal.

In the first D-type flip-flop with reset 22, the APC signal is input to a clock input terminal CLK thereof, and an output signal from a QB terminal is input to an input terminal D. The RST signal is input to a reset input terminal R thereof.

In the second D-type flip-flop with reset 23, the output signal from the QB terminal of the first D-type flip-flop with reset 22 is input to a clock input terminal CLK of the second D-type flip-flop circuit with reset 23, an output signal from a QB terminal thereof is input to an input terminal D thereof. The RST signal is input to a reset input terminal R thereof.

The APC signal delayed in the delay circuit 21 and an output signal Q1 from an output terminal Q of the first D-type flip flop with reset 22 are input to the first AND circuit 24, and the first AND circuit 24 outputs the internal LD1-APC signal.

The APC signal delayed in the delay circuit 21, a signal output from the output terminal QB of the first D-type flip flop with reset 22, and an output signal Q2 from output terminal Q of the second D-type flip-flop with reset 23 are input to the second AND circuit 25, and the second AND circuit 25 outputs the internal LD2-APC signal.

Figure 17:
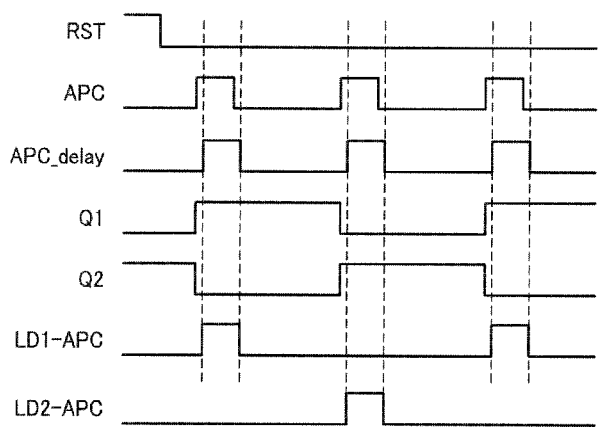
FIG. 17 is a timing chart illustrating operation in the non-synchronized type counter shown in FIG. 16.

FIG. 17 is a timing chart illustrating the operation in the non-synchronous counter 700. When the non-synchronous counter 700 receives the APC signal in a predetermined cycle after receiving the RST signal, the delay circuit 21 delays the timing of the input APC signal, and the non-synchronous counter 700 outputs a delayed APC signal (APC_delay signal) that is delayed at a predetermined time. The output signal Q1 from the output terminal Q of the first D-type flip-flop with reset 22 becomes high synchronized with a initial rise of the initial APC signal after RST signal is input, becomes low synchronized with a second rise of the APC signal, and then becomes high synchronized with a third rise of the APC signal. On the other hand, the output signal Q2 from the output terminal Q of the second D-type flip-flop with reset 23 outputs signal in reverse from the output signal Q2 from the first D-type flip-flop circuit with reset 22. Then, when the APC_delay signal is input and the output signal Q1 is high, the first AND circuit 24 outputs the internal LD1-APC signal. Alternatively, when the APC_delay signal is input and the output signal Q2 is high, the second AND circuit 25 outputs the internal LD2-APC signal.

Thus, a start timing of the APC signal is settable in the semiconductor laser driver 7-13 according to the present embodiment.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor laser driver to execute automatic power control (APC) for multiple semiconductor lasers based on a common APC output from an image controller, the semiconductor laser driver comprising:

a drive circuit to generate an individual APC signal to execute APC for each semiconductor laser based on the common APC signal, wherein the semiconductor laser driver comprises multiple drive circuits and each of the multiple drive circuits drives a corresponding semiconductor laser, wherein the drive circuit comprises:

a toggle output terminal through which a toggle signal indicating that the APC has been executed in the drive circuit is output to a next stage of the drive circuit; and a toggle input terminal through which a toggle signal output from a previous stage of the drive circuit is input to the drive circuit, and wherein the drive circuit executes APC based on the individual APC signal after the toggle signal is input to the toggle input terminal and outputs the toggle signal to the next stage of the drive circuit through the toggle output terminal after APC has been executed.

2. The semiconductor laser driver according to claim 1, wherein the drive circuit from which APC is started is externally settable.

3. The semiconductor laser driver according to claim 1, wherein, when the common APC signal output from the image controller is input to the drive circuit, the drive circuit continuously executes APC for the semiconductor lasers at a predetermined interval.

4. The semiconductor laser driver according to claim 3, wherein the predetermined interval is set externally.

5. An image forming apparatus comprising an image controller to output a common APC signal and the semiconductor laser driver according to claim 1.

6. A semiconductor laser driver to execute automatic power control (APC) for multiple semiconductor lasers based on a common APC output from an image controller, the semiconductor laser driver comprising:

a drive circuit to generate an individual APC signal to execute APC for each semiconductor laser based on the common APC signal, wherein the drive circuit further comprises a counter to count the number of common APC signals, wherein the common APC signal is a pulse signal output in a predetermined cycle and the drive circuit counts the number of common APC signals, generates each individual APC signal based on the number of counted common APC signals, and executes APC for the respective semiconductor lasers based on the individual APC signal.

7. The semiconductor laser driver according to claim 6, wherein the number of counted common APC signals at which APC is executed for the semiconductor laser is set externally.

8. The semiconductor laser drive according to claim 6, wherein the semiconductor laser comprises multiple drive circuits, and each of the drive circuits drives the multiple semiconductor lasers connected thereto.

9. The semiconductor laser driver according to claim 8, wherein a start timing of the common APC signal is set externally.

10. The semiconductor laser driver according to claim 8, wherein the drive circuit comprises:

a toggle output terminal through which a toggle signal indicating that the APC has been executed in the drive circuit is output to a next stage of the drive circuit; and a toggle input terminal through which a toggle signal output from a previous stage of the drive circuit is input to the drive circuit;

wherein, when the drive circuit receives the common APC signal after receiving the toggle signal output from the previous stage of the drive circuit and the number of common APC signals output from the image controller reaches a predetermined count number, the drive circuit executes APC for one of the multiple semiconductor laser, and then outputs the toggle signal to the next stage of the drive circuit through the toggle output terminal after APC has been executed.

11. The semiconductor laser driver according to claim 10, wherein the toggle signal is input to the drive circuit before the number of common APC signals input from the image controller through the signal line reaches the predetermined count number, and the drive circuit generates the individual APC signal after the number of common APC signals reaches the predetermined count number and executes APC based on the individual APC signal.

12. The semiconductor laser driver according to claim 10, wherein the counter in a target drive circuit mistakenly counts a noise and mistakenly counts a previous stage of predetermined count number of common APC signals for a target predetermined count number, and the target drive circuit generates the individual APC signal after the toggle signal is input from the previous stage of the drive circuit and executes APC based on the individual APC signal.

13. The semiconductor laser driver according to claim 10, wherein the toggle signal is not input to the drive device even when the number of common APC signals reaches the predetermined count number, and the drive circuit generates the individual APC signal when a predetermined second count elapses after the number of common APC signals reaches the predetermined count number and executes APC based on the individual APC signal.

14. An image forming apparatus comprising an image controller to output a common APC signal and the semiconductor laser driver according to claim 6.

15. A semiconductor laser driver to execute automatic power control (APC) for multiple semiconductor lasers based on a common APC output from an image controller, the semiconductor laser driver comprising:

a drive circuit to generate an individual APC signal to execute APC for each semiconductor laser based on the common APC signal, wherein, when the semiconductor laser driver executes APC for one of the multiple semiconductor lasers, the drive circuit sets a current flowing to other multiple semiconductor lasers below an oscillation threshold current (including 0 mA).

16. An image forming apparatus comprising an image controller to output a common APC signal and the semiconductor laser driver according to claim 15.

17. A semiconductor laser driver to execute automatic power control (APC) for multiple semiconductor lasers based on a common APC output from an image controller, the semiconductor laser driver comprising:

a drive circuit to generate an individual APC signal to execute APC for each semiconductor laser based on the common APC signal, wherein the drive circuit detects a rising edge of the common APC signal output from the image controller and executes APC for the semiconductor lasers within a predetermined time period after detection of the rising edge.

18. The semiconductor laser driver according to claim 17, wherein the predetermined time period is set externally.

* * * * *